(12) United States Patent
Routberg et al.

(10) Patent No.: US 7,135,653 B2
(45) Date of Patent: *Nov. 14, 2006

(54) MULTI-PHASE ALTERNATING CURRENT PLASMA GENERATOR

(76) Inventors: Alexander P. Routberg, 150 Spinnaker Ridge Dr., Apt. D-116, Huntsville, AL (US) 35824; Philip G. Rutberg, Viborgskoe Shosse 7-1-25, St.-Petersburg (RU) 191065; Alexei A. Safronov, Shikolnaya 58 Flat 26, St.-Petersburg (RU) 197183; Vasily N. Shiryaev, Hoshimina 13 Flat 165, St.-Petersburg (RU) 194350

( * ) Notice: Subject to any disclaimer, the term of this patent is extended or adjusted under 35 U.S.C. 154(b) by 0 days.

This patent is subject to a terminal disclaimer.

(21) Appl. No.: 10/731,358

(22) Filed: Dec. 9, 2003

(65) Prior Publication Data

US 2005/0122050 A1    Jun. 9, 2005

(51) Int. Cl.
*B23K 9/00* (2006.01)
(52) U.S. Cl. .............................. 219/121.48; 219/121.5; 219/121.51
(58) Field of Classification Search ........... 219/121.48, 219/121.5, 121.51, 121.54, 121.55, 121.57; 118/61; 315/111.71, 111.21, 111.11
See application file for complete search history.

(56) References Cited

U.S. PATENT DOCUMENTS

| | | | |
|---|---|---|---|
| 4,013,867 A | 3/1977 | Fey | 219/121 P |
| 4,543,470 A | 9/1985 | Santen et al. | 219/383 |
| 5,651,825 A * | 7/1997 | Nakahigashi et al. | 118/723 ME |
| 5,801,489 A | 9/1998 | Chism, Jr. et al. | 315/111.21 |
| 6,169,674 B1 * | 1/2001 | Owen | 363/64 |
| 6,781,087 B1 * | 8/2004 | Chism et al. | 219/121.48 |

* cited by examiner

*Primary Examiner*—Tuyet Thi Vo
(74) *Attorney, Agent, or Firm*—David E. Mixon; Bradley Arant Rose & White

(57) ABSTRACT

A plasma generation system that is powered with an alternating current power source has been developed. The system includes a plasma generator that heats gas to a high temperature to form plasma. The gas is heated by passing through an electrical arc generated by electrodes. The gas is fed to the generator by a feed system comprising a plurality pneumatic feed devices that supply the plasma-forming gas. The plasma generator is powered by an alternating current power source.

12 Claims, 14 Drawing Sheets

MULTI-PHASE ALTERNATING CURRENT PLASMA GENERATOR

BACKGROUND OF INVENTION

1. Field of the Invention

The invention relates generally to plasma generators. More specifically, the present invention relates to multi-phase alternating current plasma generators.

2. Background Art

The handling and disposal of industrial, commercial and residential waste is a matter of growing concern. Increased environmental regulation coupled with increasing amounts of waste generated combine to create a demand for a method of disposal of toxic waste that is both effective and economical. High temperature burning or combustion of waste has been considered one of the most promising techniques of disposal. An added benefit is that pyrolysis gasification of the waste may also generate energy.

One technique of high temperature burning of waste is called a plasma method. Plasma is a very high temperature ionized gaseous discharge. The plasma includes neutral particles, ionized particles, and free electrons when taken as a whole, are electrically neutral. Plasma is created using a plasma generator, which is a device that converts energy from an electrical arc to energy from blown gas. High temperature applications of plasma generators are used for such waste disposal applications as vitrification of radioactive materials and decontamination of hazardous substances such as medical waste.

Plasma generators typically have a housing that contains a plurality of arc heaters. The arc heaters are power by a direct current (DC) electrical source. As they fire, the hot plasma that is created is forced through a nozzle in the housing into an incineration chamber. Waste is fed into the chamber and burned. By products of the processing may include the residue of the burned waste and syn-gas. Syn-gas is a hydrogen-rich byproduct, which may be removed and used as a fuel for electric power generation. However, the DC powered arc heaters have ballast active resistors that may result in irreversible losses in the power supply. What is needed is a plasma generator that is powered by an alternating current (AC) power source.

SUMMARY OF INVENTION

In some aspects, the invention relates to a plasma generation system, comprising: a plasma generator; a feed system comprising a plurality pneumatic feed devices that supply plasma-forming gas to the plasma generator; and an alternating current power source that powers the plasma generator.

In other aspects, the invention relates to a plasma generation system, comprising: means for feeding a gas to a plasma generator with a plurality of pneumatic feed devices; means for heating the gas in the plasma generator to form plasma; and means for directly powering the plasma generator from an alternating current power source.

Other aspects and advantages of the invention will be apparent from the following description and the appended claims.

BRIEF DESCRIPTION OF DRAWINGS

It should be noted that identical features in different drawings are shown with the same reference numeral.

DETAILED DESCRIPTION

The embodiments of the present invention shown in FIGS. 1, 2, 5 and 6 are powered with an alternating current (AC) power source directly from a conventional utility network. The generator is powered through a multi-phase transformer that has a number of phases that are equal to the number of electrodes in the generator. Plasma generators may use any number of phases/electrodes including up to 24 or more electrodes for powerful systems of 2 or more Megawatts (MW) of power in one housing. The generator may operate at about 90% efficiency.

Figure 1:
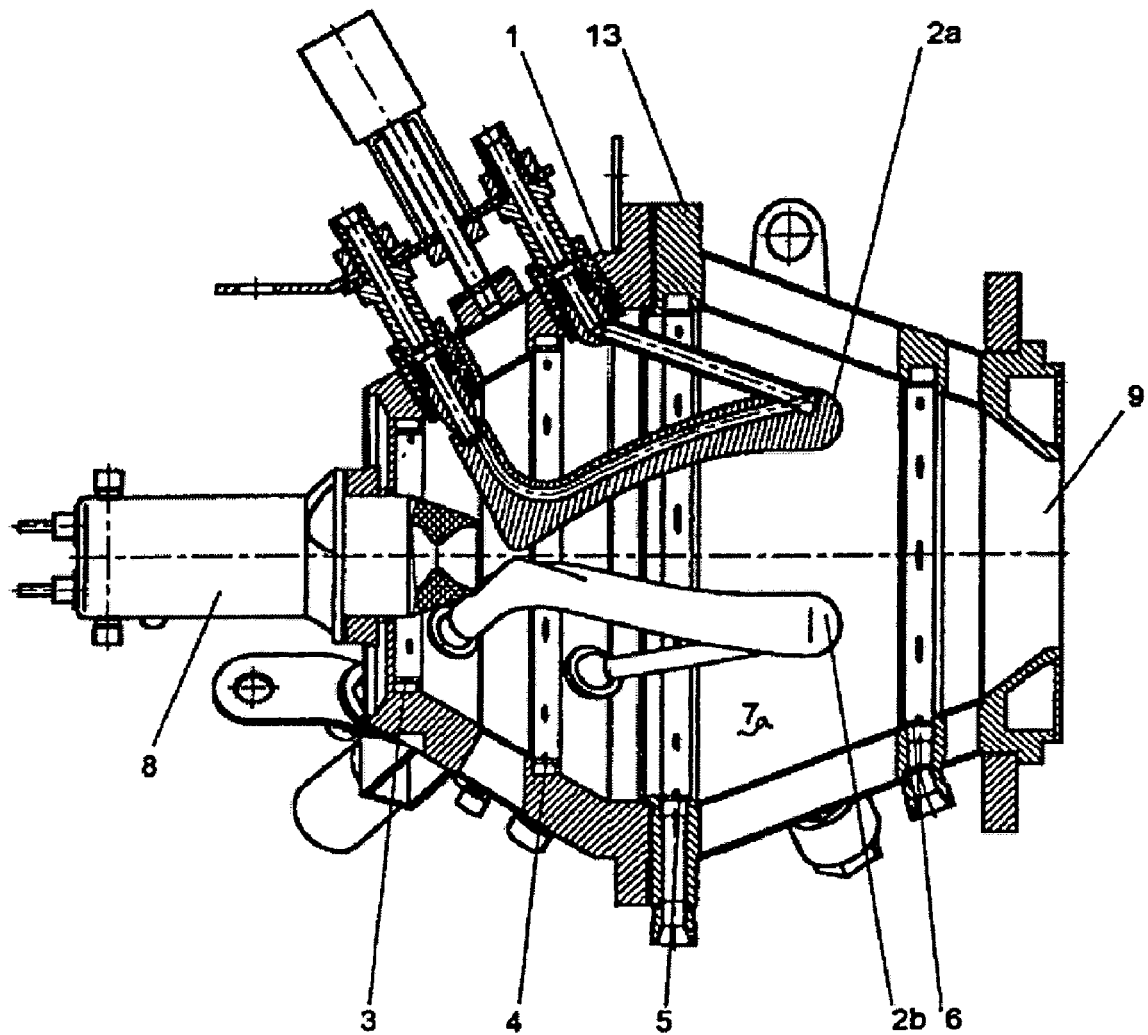
FIG. 1 shows a cross sectional diagram of a three phase AC plasma generator with a conical nozzle in accordance with one embodiment of the present invention.

FIG. 1 shows a cross sectional diagram of one embodiment of a three phase AC plasma generator with a conical nozzle. The generator includes an electrode unit 1 that houses three separate electrodes 2a and 2b (only two are shown) and a plasma injector 8. The three electrodes are arranged equidistantly in a circular configuration around the interior of the electrode unit 1. The electrode unit 1 is attached to a nozzle unit 13 that includes a conical shaped discharge chamber 7a that feeds a discharge 9. Pneumatic rings 3, 4, 5, and 6 are located around the interior of the electrode unit 1 and the nozzle unit 13. The pneumatic rings 3, 4, 5, and 6 feed a plasma forming gas into the chamber.

Figure 2:
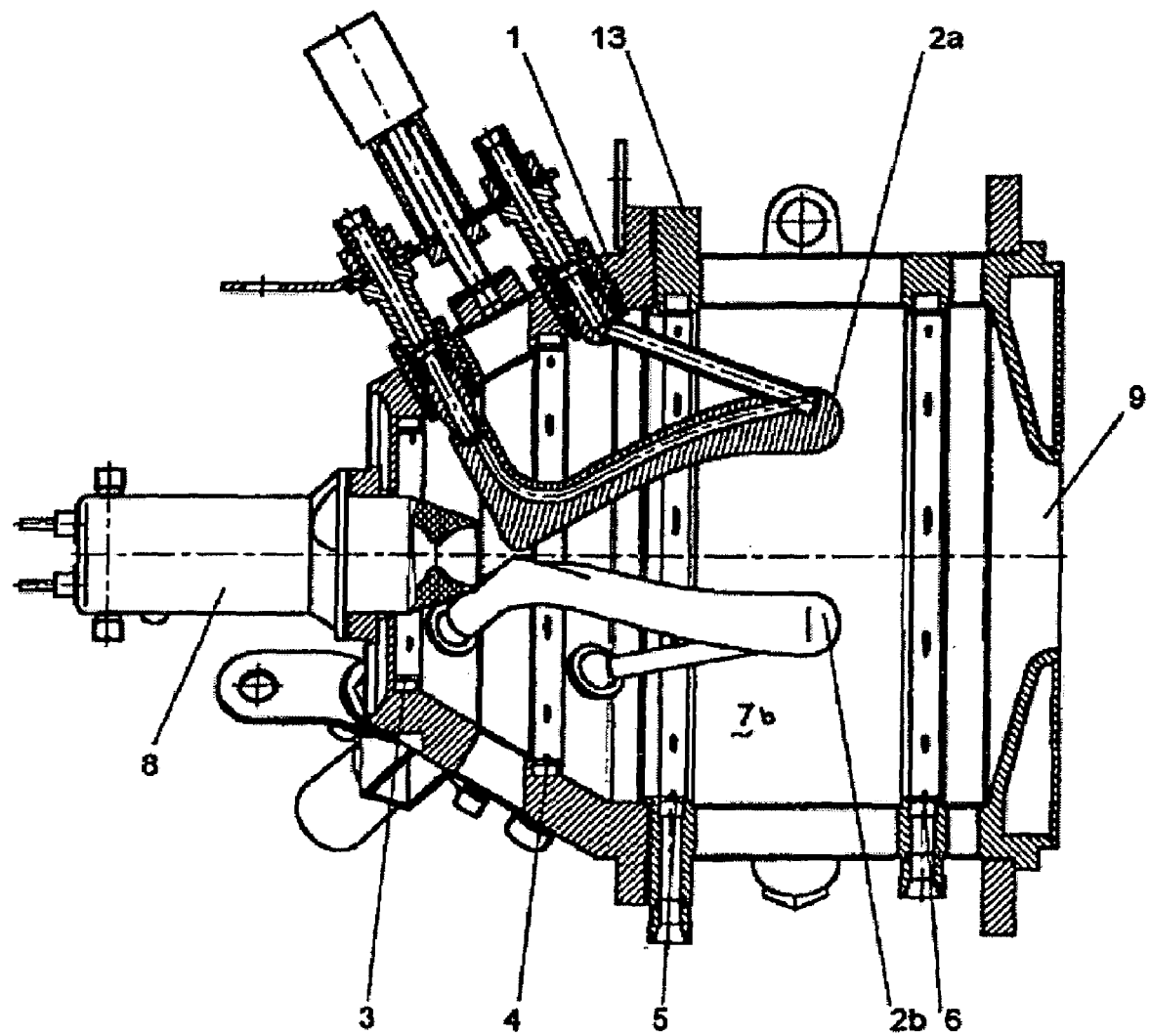
FIG. 2 shows a cross sectional diagram of a three phase AC plasma generator with a cylindrical nozzle in accordance with one embodiment of the present invention.

FIG. 2 shows a cross sectional diagram of a three phase AC plasma generator with a cylindrical nozzle in accordance with an alternative embodiment of the present invention. The generator shown in FIG. 2 is identical to the embodiment shown in FIG. 1 with the exception the discharge chamber 7b in the FIG. 2 is cylindrically shaped while the discharge chamber 7a in FIG. 1 is conically shaped.

For plasma generators of greater than 1 MW, a transformer with split secondary windings and switched primary windings may be used with the power supply. The primary windings may have a manual switch of voltage (MSV). Such devices allow optimal matching of the load with the power supply at voltages from 200 Volts (V) to 4000 (V). The voltage of the AC power supply should be higher than the voltage on the arc of the generator that is determined by the value of cos ($\phi$) of the system.

Figure 3:
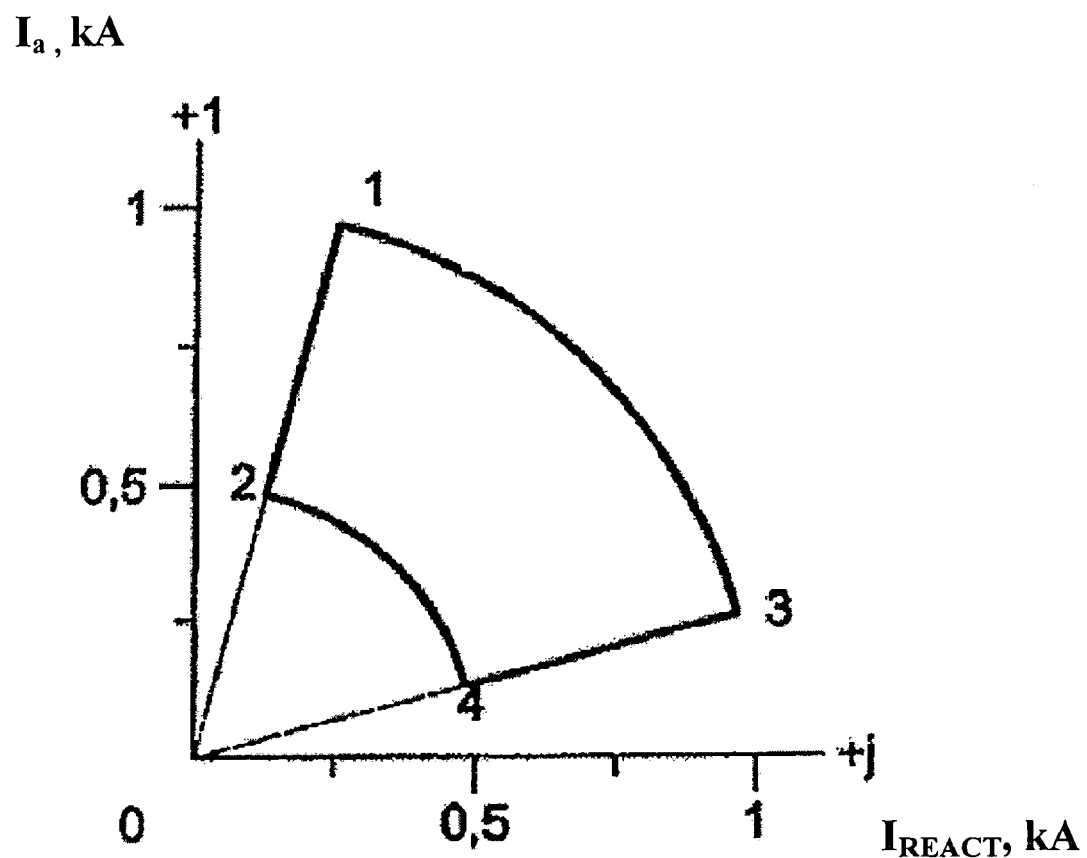
FIG. 3 shows a graph of the burning areas of an AC plasma generator in accordance with one embodiment of the present invention.

The stability of the performance of the generator is reflected in FIG. 3 that shows a graph of the burning area of a three phase AC plasma generator in accordance with one embodiment of the present invention. This graph depicts the value of the active current ($I_a$) against the value of the reactive current ($I_{react}$). From these values, the boundary of points 1–2 shows the upper boundary to maintain steady arc burning. The boundary of points 1–3 shows the upper boundary of heat loads. The boundary of points 2–4 shows the lower boundary of minimum temperature to ensure steady performance. Finally, the boundary of points 3–4 is determined by the power circuitry configuration within the limits of the values of cos (0.3) and cos (0.8).

Figure 4A:
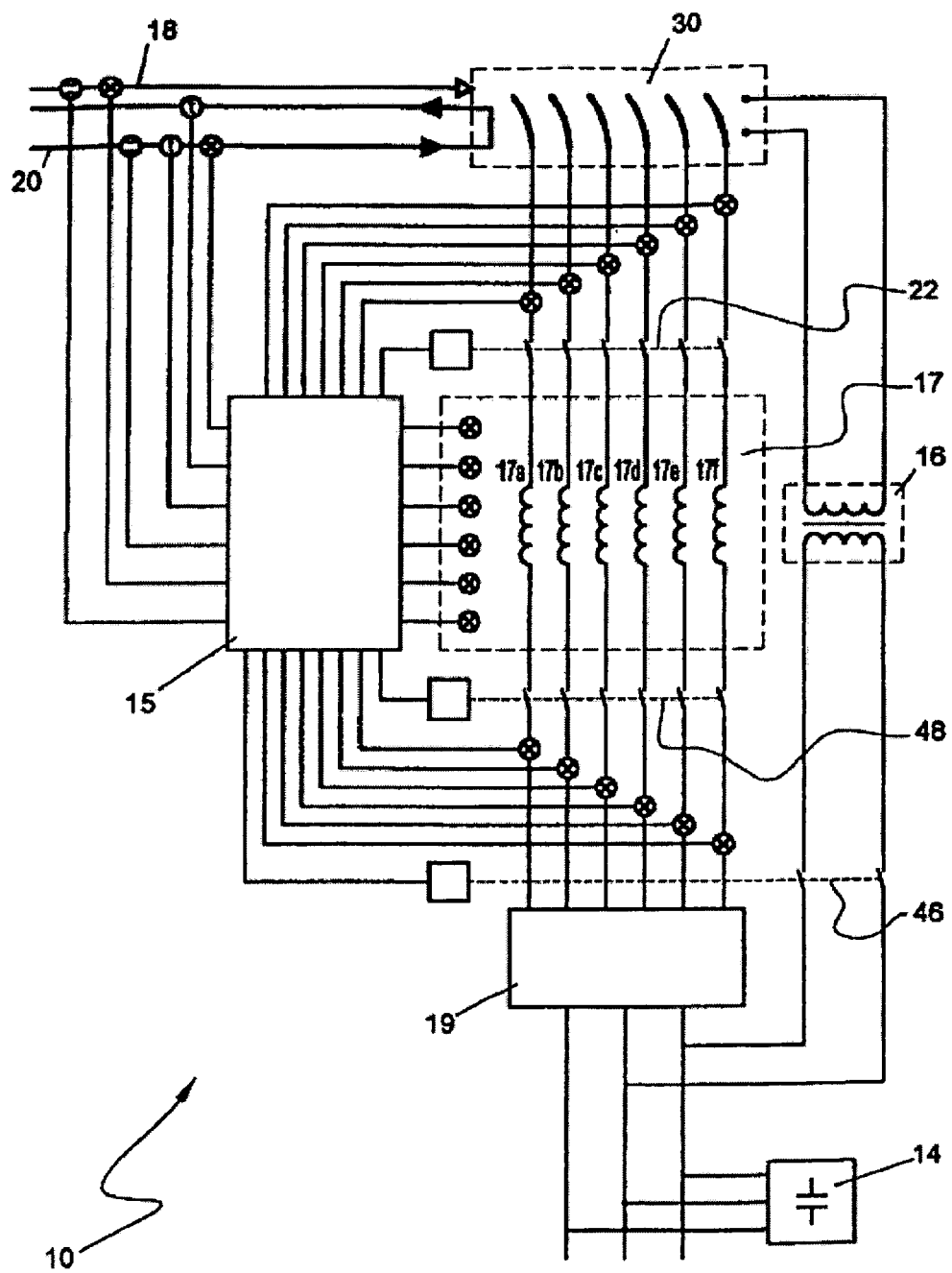
FIG. 4a shows a block diagram of components of a six phase AC plasma generator in accordance with one embodiment of the present invention.
Figure 12:
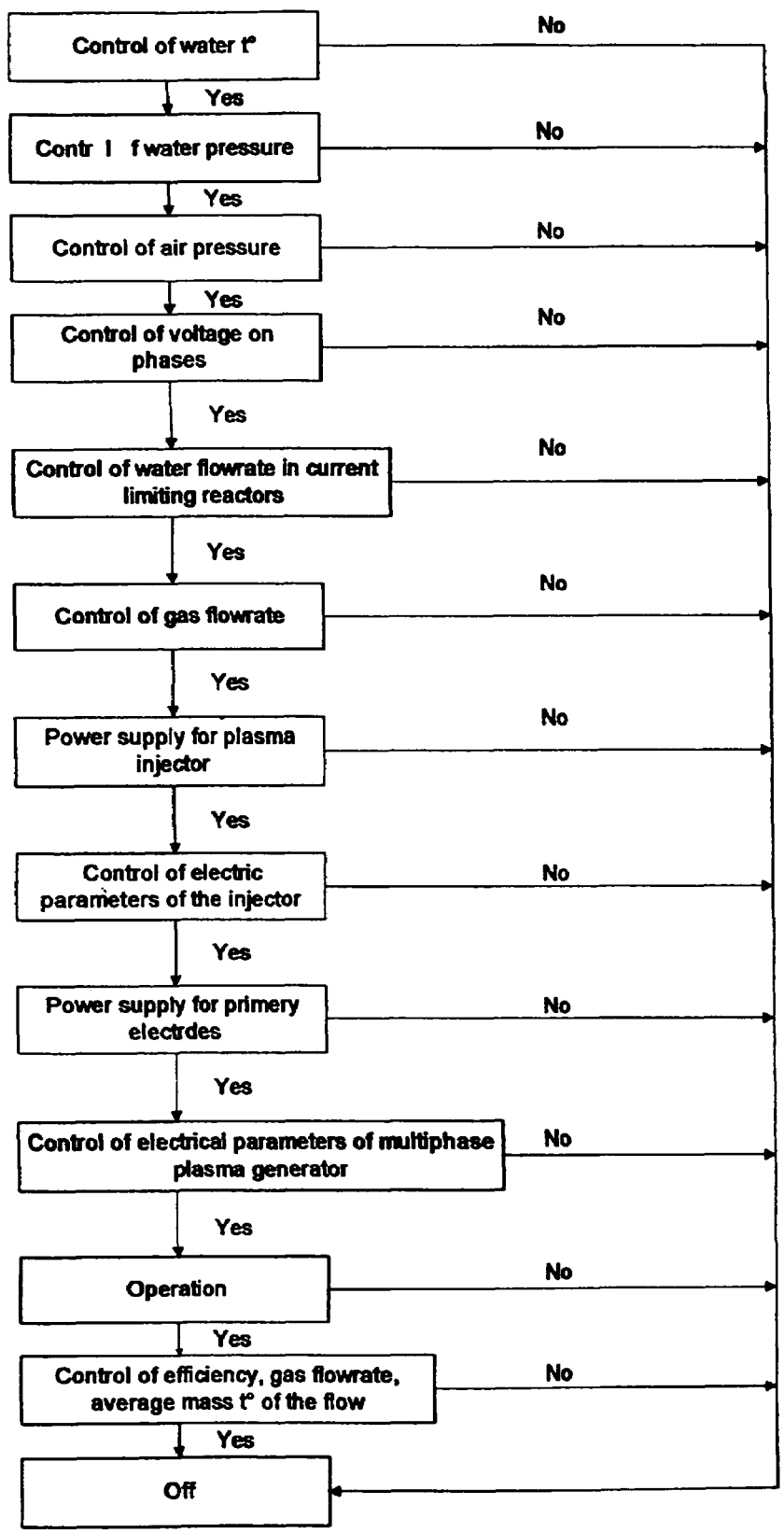
FIG. 12 shows a flowchart of the steps for operating an AC plasma generator in accordance with one embodiment of the present invention.

In alternative embodiments, the plasma generator may use six phases. This embodiment includes a six phase high-voltage transformer that powers a plasma generator with six separate electrodes. FIG. 4a shows a block diagram of components of a six phase AC plasma generator system 10. The system 10 includes a six-phase transformer 19 that is connected to a conventional utility network (not shown) along with a capacitive compensator 14. The transformer 19 directly powers the plasma generator 30 with alternating current through a bank of six current limiting reactors 17a–17f. The current limiting reactors 17a–17f may include taps that allow step-by-step regulation of the current flow. For example, the current flow could be regulated to be stepped up in regular intervals from 100 A (amperes) to 1500 A The generator is fed by a manifold of plasma forming gas 18 and manifold for the cooling system 20. The cooling system circulates a liquid coolant such as water. However, other suitable liquid coolants could be used in alternative embodiments. Also, a single-phase transformer 16 that is controlled by an automatic switch 46 is used to power a plasma injector for the generator 30. An electronic controller 15 is used to regulate the performance of each of the components. The controller 15 provides control to the electrical power, the generator efficiency, the average mass temperature, the plasma flow rate, and emergency cut-offs of the system. The controller 15 monitors system performance through current and voltage sensors located at various points in the electrical power circuit. Additionally, the controller 15 monitors flow meters, thermocouples, and flow transducers that are located at various points in the cooling system. The controller 15 also monitors and controls the gas supply with a gas flow meter and gas flow transducer located within the gas supply system. FIG. 12 shows a flow chart of all of the operating parameters of the system. The electronic controller 15 uses these parameters if the system is operating properly and safely. If one of these parameters is not satisfactorily met, the controller 15 will shut the system down.

Figure 4B:
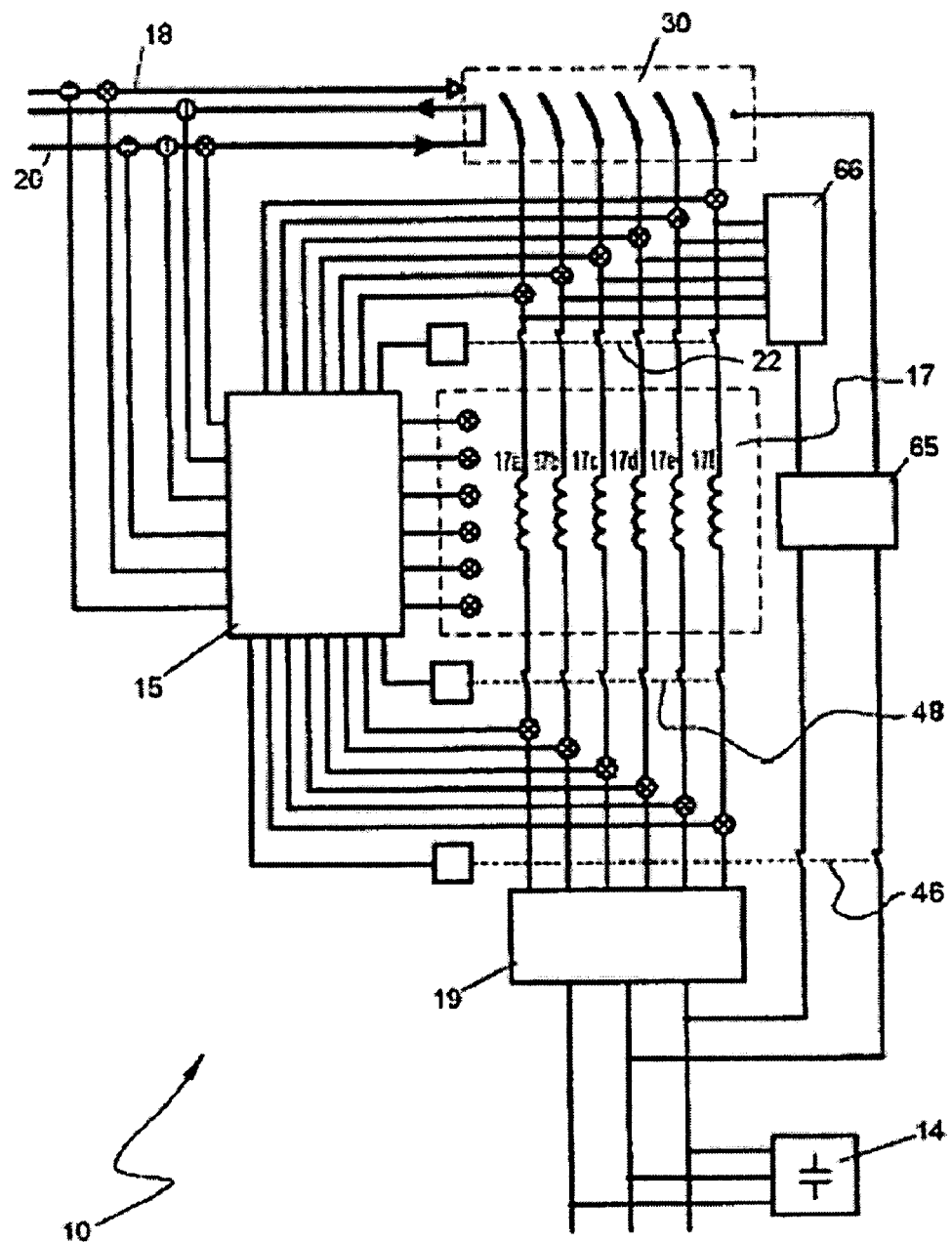
FIG. 4b shows a block diagram of components of an alternative six phase AC plasma generator in accordance with one embodiment of the present invention.

FIG. 4b shows a block diagram of components of an alternative six phase AC plasma generator. FIG. 4b shows a generator that use a high frequency power supply of 1–10 kilohertz (kHz) that makes of plasma jet with a concentration of electrons of [($n_e$)~$10^3$–$10^{14}$/cm$^3$]. One of the poles of the power source is connected through separation filters 66 to each electrode. This embodiment allows a high frequency spark breakdown between the electrodes that is synchronized with the high frequency power supply.

Figure 5:
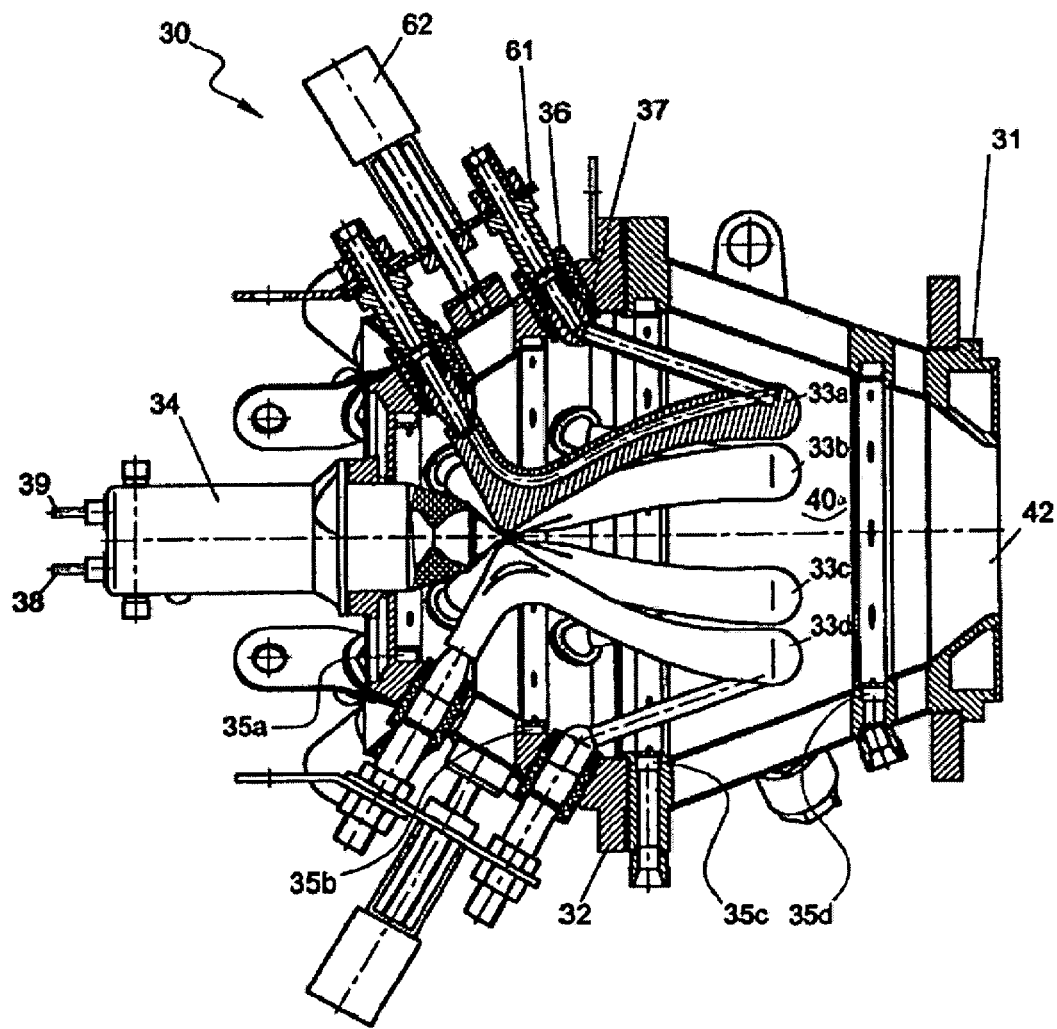
FIG. 5 shows a cross sectional diagram of a six phase AC plasma generator with a conical nozzle in accordance with one embodiment of the present invention.

FIG. 5 shows a cross sectional diagram of a six phase AC plasma generator 30 with a conical nozzle in accordance with one embodiment of the present invention. As with the three phase AC generators shown previously, the six-phase generator 30 has an electrode unit 32 that connects to the nozzle unit 31. The electrode unit 32 holds a plasma injector 34 and six separate electrodes 33a–33d (only four are shown). The six electrodes are arranged equidistantly in a circular configuration around the interior of the electrode unit 32. The nozzle unit 31 has a conical shaped discharge chamber 40a that feeds a discharge nozzle 42. Pneumatic rings 35a–35d are located around the interior of the electrode unit 1 and the nozzle unit 13.

Figure 7:
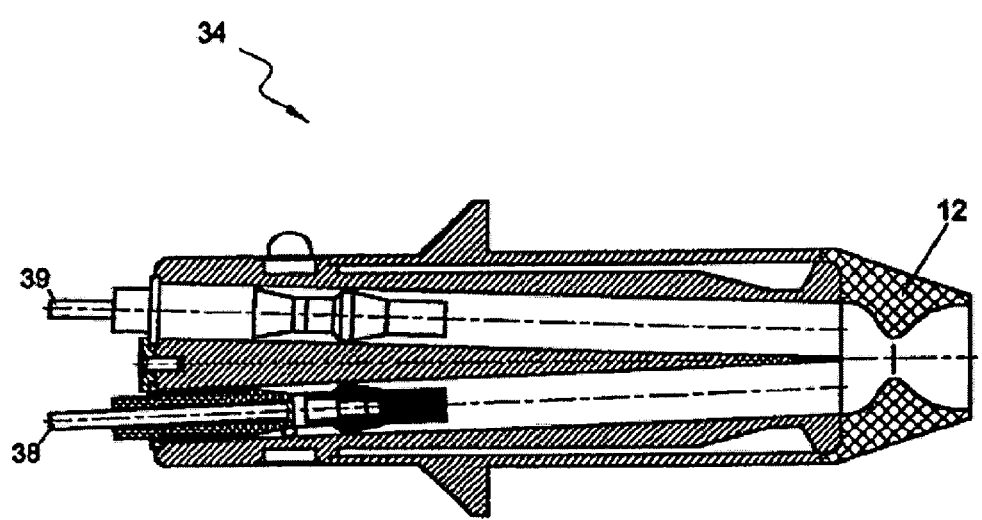
FIG. 7 shows a cross sectional diagram of a gas injector in accordance with one embodiment of the present invention.

Power for the plasma injector 34 is fed through the two electrodes 38 and 39 a shown in FIG. 7. The injector 34 provides the necessary concentration of current carriers [($n_e$)~$10^{13}$–$10^{16}$/cm$^3$] in the discharge chamber 40a. The power of the injector 34 can reach 4–10 kilowatts (kW). The geometry of the injector nozzle permits directing the plasma stream of the injector along the electrodes into the discharge chamber 40a. This ensures a stable and diffuse burning of arcs and smooth current flow. The electrodes 38 and 39 are connected to the external power source through a transformer 16 as shown in FIGS. 4a and 4b. The electrode unit 32 and the nozzle unit 31 are joined by flanges that form spaces within the generator 30 for circulating the coolant from cooling system.

The six electrodes are held in place with the electrode unit by an insulating bushing 36, a ceramic insulator 37, and an insulating plate 61. The ends electrodes are spaced circumferentially around the interior of the discharge chamber 40a. When operating, the electrodes move radially around the interior of the generator. The movement of the electrodes is powered by an electric drive 62. Each electrode is installed at a certain minimum distance from the two adjacent electrodes. In this distance between the electrodes, called the "ignition zone", the ignition of the basic arc takes place to form a plasma jet that exits through the discharge nozzle 42. The electrodes are powered directly from the current limiting reactors 17a–17f that are connected to the separate phases of the six-phase transformer 19 shown in FIGS. 4a and 4b.

Figure 6:
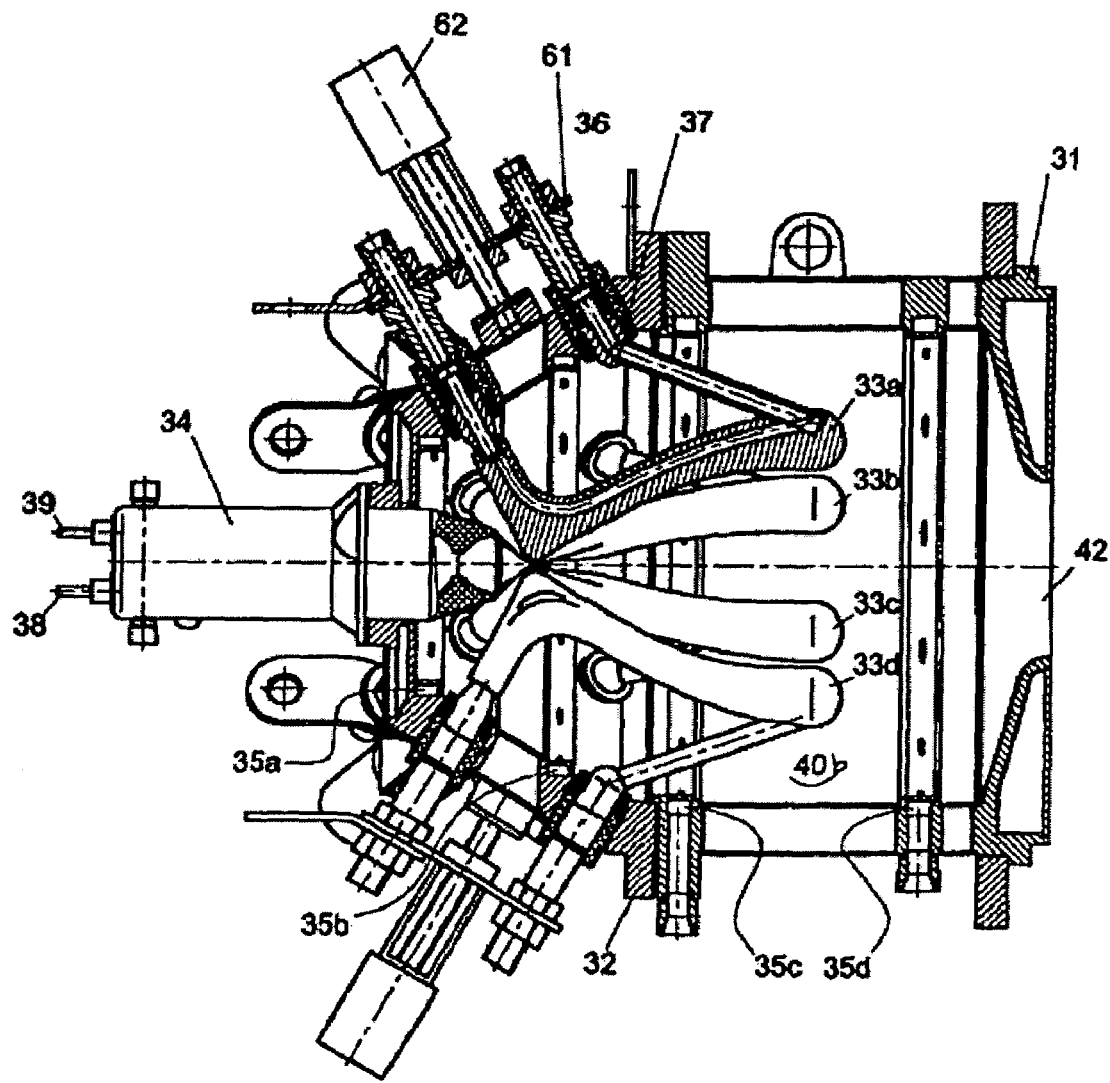
FIG. 6 shows a cross sectional diagram of a six phase AC plasma generator with a cylindrical nozzle in accordance with one embodiment of the present invention.

FIG. 6 shows a cross sectional diagram of an alternative embodiment of a six phase AC plasma generator with a cylindrical nozzle. The generator shown in FIG. 6 is identical to the embodiment shown in FIG. 5 with the exception the discharge chamber 40b in the FIG. 2 is cylindrically shaped while the discharge chamber 40a in FIG. 1 is conically shaped. Further, components of a six-phase generator shown in FIGS. 5 and 6 are identical to corresponding components of a three-phase generator shown in FIGS. 1 and 2. The difference between the two embodiments of generators being the number of electrodes and corresponding phases in their power supply. Consequently, descriptions for common components (e.g., the plasma injector, the individual electrodes, pneumatic rings, etc.) should be considered to apply to all embodiments unless indicated otherwise.

The holes in the pneumatic rings 35a–35d are tangentially oriented in relation to the interior of the discharge chamber 40a. This arrangement allows a thin layer of plasma forming gas to be injected along the interior wall of the discharge chamber 40a and eventually become a vortex of plasma. The vortex stream draws out an electrical arc from the electrode 51 and as a result increasing the voltage drop across the arc along with its power. Meanwhile, the entering stream of gas forms a cooler layer of gas adjacent to the wall, which protects the chamber from the high temperatures of the arc. The first pneumatic ring 35a ensures protection of the injector 34 and powerful turbulization of a gas stream. This provides effective turbulent heat exchange between the arcs and the gas. The second and third pneumatic rings 35b and 35c protect the wall of the discharge chamber 40a. The fourth pneumatic ring 35d protects the discharge nozzle 42 of the generator.

Figure 8:
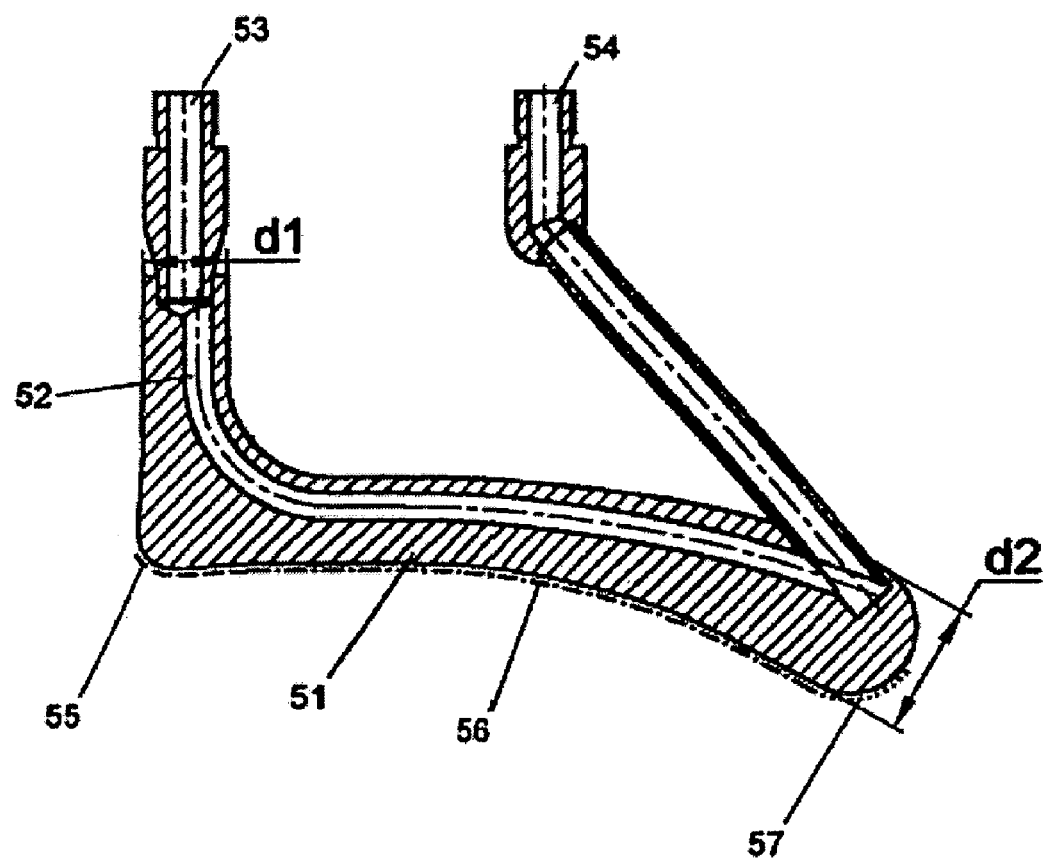
FIG. 8 shows a cross sectional diagram of an electrode in accordance with one embodiment of the present invention.

FIG. 8 shows a cross sectional diagram of an electrode 51 used in embodiments of the present invention. The body of the electrode is a rod of variable dimensions that is made of an electrically conductive material such as copper. However, other suitable conductive materials could be used as required by performance criteria. The diameter of the electrode increases towards the nozzle, which corresponds to the basic zone of arc burning. The interior of the electrode 51 contains a cooling channel 52 that has connecting pipes 53 and 54 on each end. The connecting pipes 53 and 54 are connected with the cooling system and a coolant, such as water, is circulated through the electrode 51. The surface of the electrode is divided into three sections: repeated ignition section 55; working section 56; and contact section 57. The contact section 57 is the most heat stressed section of the electrode 51 because it is located in the most intensive vortex streams of plasma forming gas. Consequently, the contact zone 57 is typically the thickest portion of the electrode 51.

Along the outside perimeter of the plasma generator, a drive is located for each electrode. Each drive remotely regulates the inter-electrode gap of its corresponding electrode by maintaining the gap within a specified range. This allows stabilization of power usage, outlet parameters, and generator efficiency. The drive may be controlled manually or automatically.

In an AC plasma generator, each electrode periodically functions as a cathode (positive electrical terminal) and an anode (negative electrical terminal). The arcs in the discharge chamber are formed at the moment of equality of the phase voltages. In a three-phase embodiment, this moment of equality occurs at an angle of 30°. The arc for each electrode burns for a full 120°. The difference in phase shift between the arc currents of the electrodes is 60°. As a result, two arcs may be simultaneously burning in the discharge chamber of the three-phase generator at any one time. In a six-phase embodiment, the arc for each electrode burns for a full 60°. The difference in phase shift between the arc currents of the electrodes is 30°. As a result, eight arcs may be simultaneously burning in the discharge chamber of the six-phase generator at any one time.

The application of divergent massive electrodes with an off-center interior cooling channel allows an increased lifespan for the generator. The angle of declination of an electrode is determined based on the power and the flowrate of the plasma-forming gas. The angle is typically between 0° and 60° in relation to the plasma generator axes. The velocity of the arc movement along the body of the electrode is dependent upon the angle of divergence between adjacent electrodes and the magnitude of the arc current. For example, the velocity of the arc movement increases from 10 m/s (meters/second) to 30 m/s as the corresponding current increases from 150 A to 1000 A. The arrangements of electrodes as disclosed in these embodiments, allow for arc movement velocities from 10–90 m/s with corresponding current ranges from 100 A–1700 A. The velocity of the arc current decreases as the arc moves to the end of the electrode body. This is a result of the increase in distance between adjacent electrodes and the corresponding decrease in the strength of the magnetic field acting upon the arc. The divergence angle of adjacent electrodes is typically optimized based of the power and the flowrate of the plasma-forming gas.

Figure 9A:
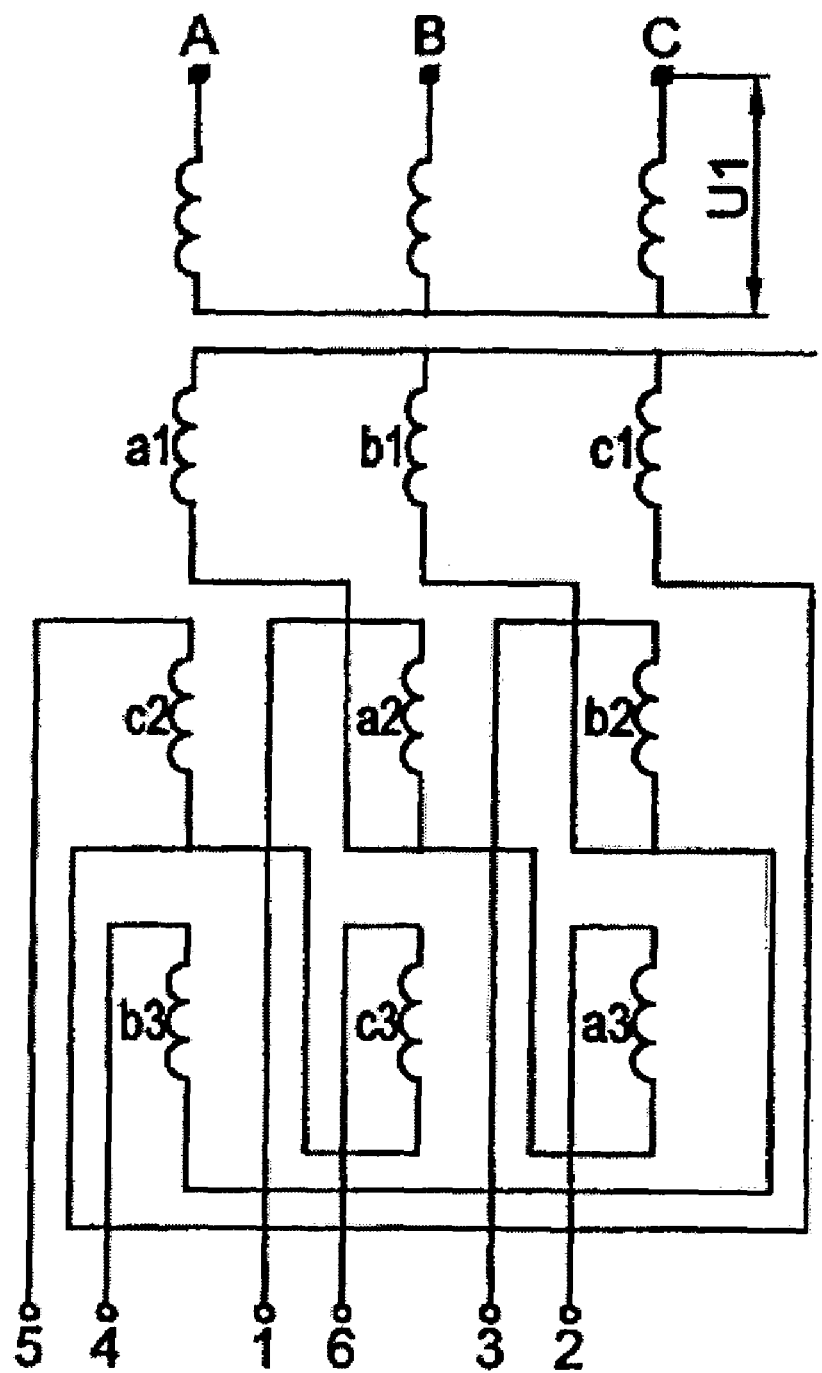
FIGS. 9a and 9b show a diagram of a power transformer (wye—double zigzag connection) for a six-phase AC plasma generator in accordance with one embodiment of the present invention.
Figure 9B:
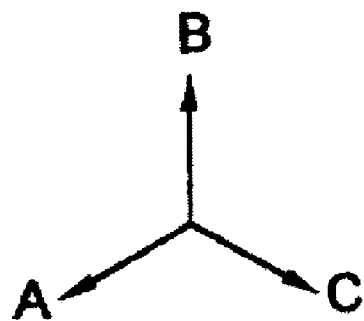
Figure 9B:
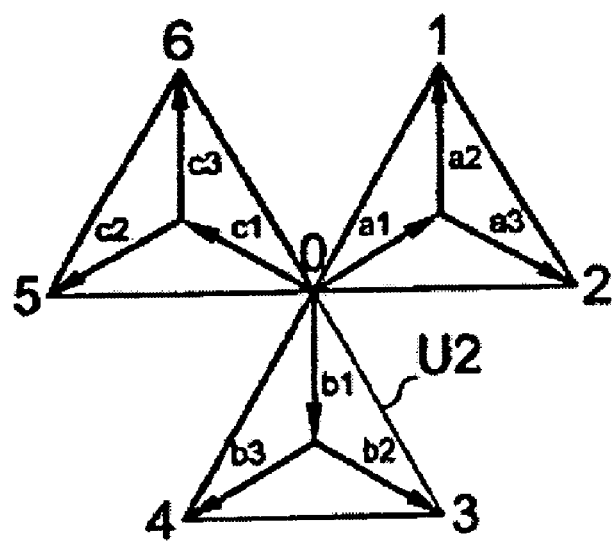

FIGS. 9–11 show several examples of power supply circuits for a six-phase transformer. FIG. 9a shows a diagram of a six-phase transformer connected in a "wye—double zigzag" configuration. The primary winding of the transformer ("A, B, and C") are connected in a wye configuration. The secondary windings of the transformer ("a1–3, b1–b3, and c1–c3") are divided into three equal sections that are connected in a zigzag configuration. For example, the end of segment a1 that is located on rod A, is connected with both segments a2 and a3.

The ends of the windings ("1–6") are connected to corresponding electrodes on the plasma generator. FIG. 9b shows a phase diagrams of the primary winding ("A, B, and C") and phase diagrams of the secondary winding ("a1, b1, and c1") that is rotated 180° relative to the primary winding. The phase diagrams of the other subsections ("a2 and a3") are geometrically subtracted from their initial section ("a1"). Once this is done for each phase of the secondary windings, the result is the symmetrical power diagram shown is FIG. 9b.

Figure 10A:
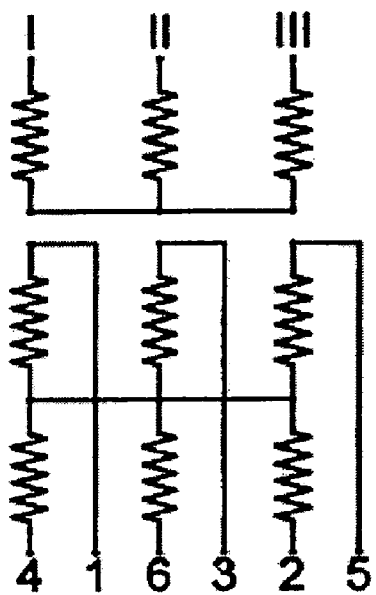
FIGS. 10a and 10b show a diagram of a power transformer (wye connected) for a six-phase AC plasma generator in accordance with one embodiment of the present invention.
Figure 10B:
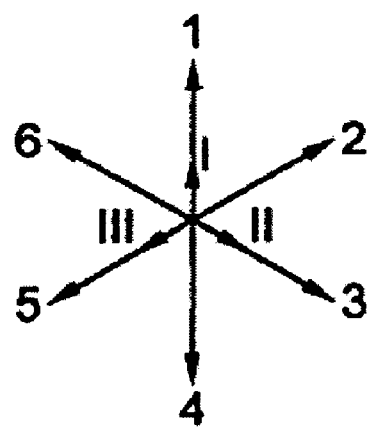
Figure 11A:
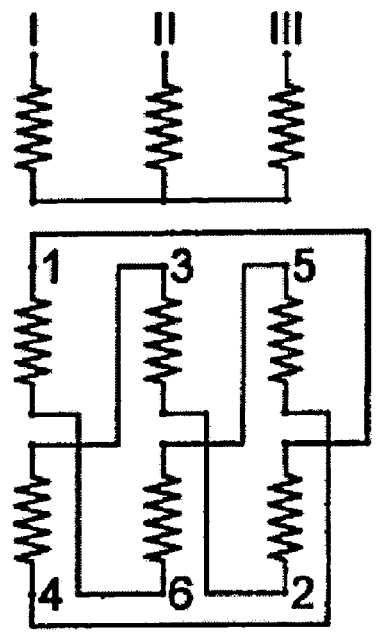
FIGS. 11a and 11b show a diagram of a power transformer (polygon connected) for a six-phase AC plasma generator in accordance with one embodiment of the present invention.
Figure 11B:
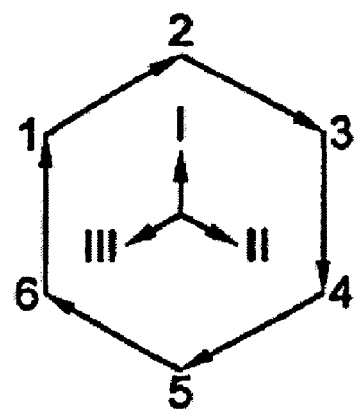

FIGS. 10a, 10b, 11a, and 11b show alternative configurations of the six-phase transformer. FIG. 10a shows a diagram of a six-phase transformer where both primary and secondary windings are connected in a wye configuration. FIG. 10b shows the phase diagram that corresponds to the transformer configuration shown in FIG. 10a. FIG. 11a shows a diagram of a six-phase transformer where the primary winding is wye connected and the secondary winding is connected in a polygon configuration. FIG. 11b shows the phase diagram that corresponds to the transformer configuration shown in FIG. 11a.

FIG. 12 shows a flowchart of the steps for operating an AC plasma generator in accordance with one embodiment of the present invention. The generator may operate in three distinct modes: On/Off/Work in a normal operation mode; On/Off/Work in a setup mode; and an Automatic Cut-Off mode for emergency operations. System monitors will determine if the parameters measured in the steps shown in FIG. 12 fall outside the predetermined tolerance limits.

Advantages of the embodiments of the present invention include a plasma generator that is power by an AC source. The plasma generator is powered through a multi-phase transformer that includes a compensation scheme for reactive power. This avoids distortions in the power supply and allows for steady arc burning within a wide power range. Another advantage is the arrangement of the feeding system of the plasma-forming gas. The feeding system with its pneumatic rings ensures increased efficiency of plasma formation while protecting the interior of the discharge chamber from extreme temperatures.

While the invention has been described with respect to a limited number of embodiments, those skilled in the art, having benefit of this disclosure, will appreciate that other embodiments can be devised which do not depart from the scope of the invention as disclosed here. Accordingly, the scope of the invention should be limited only by the attached claims.

What is claimed is:

1. A multiphase alternating current plasma generator, comprising;
    an electrode unit comprising fixed electrodes, plasma injector that introduces an ionized stream into area of minimum convergence between the fixed electrodes, and a nozzle unit joint, wherein the electrode unit is joined with the nozzle unit to form a united electric discharge chamber;
    a multiphase transformer that is connected to a common low-voltage alternating current network, wherein each fixed electrode is fed from the multiphase transformer;
    a plurality of pneumatic feed rings that feed a plasma-forming gas from an external source into the electric discharge chamber, wherein the pneumatic feed rings comprise radial holes tangentially located along the walls of the electric discharge chamber so as to provide a boundary layer of plasma-forming gas along the chamber walls, wherein the temperature of the boundary layer is significantly lower than in the main plasma-forming gas stream along the chamber length; and
    a controller with monitoring circuits that ensures operation of the plasma generator include an emergency cut-off operation.

2. The generator of claim 1, further comprising;
    a nozzle unit of cylindrical shape that allows changing the length and the diameter of the electric discharge chamber, the outlet temperature of the electric discharge chamber, and plasma-forming gas flowrate through of the electric discharge chamber.

3. The generator of claim 1, wherein the multiphase transformer provides a supply voltage of control 220 V and power voltage between 400 V–4000 V, where the power voltage allows step increases in voltage that allows sharply increase the plasma generator power at the same current.

4. The generator of claim 1, wherein the plasma injector comprises a single-phase AC plasma 4–10 kW generator arid a special profiled nozzle that is joined to the electrode unit of the plasma generator, wherein the special profiled nozzle creates concentration of electrons $n_e \sim (10^{13}-10^{14})$ cm$^{-3}$ in the electric discharge chamber volume that reduces wear of electrodes to less than $10^{-6}$ g/C.

5. The generator of claim 1, wherein includes the plasma injector includes a high frequency power source with supply voltage frequency between 1–10 kHz, where the injector simultaneously supplies an ionized jet of plasma-forming gas into the gap between power electrodes and simultaneously switches the poles of the injector power source to each power electrode.

6. The generator of claim 1, wherein the multiphase transformer includes an amount of secondary windings equal to the amount of electrodes and a capacity condenser that allows the generator to achieve a power factor close to 1.

7. The generator of claim 1, wherein the plurality of pneumatic feed rings are tangentially placed uniformly along the electric discharge chamber length with radial holes to create a diffuse turbulent discharge of plasma-forming gas that forms a boundary layer along the walls with the significantly lower temperature than in the main gas stream.

8. The generator of claim 1, wherein the fixed electrodes installed in the electric discharge chamber have variable cross-section area that is 2.8 times larger on the end of the electrode than at the beginning of the electrode.

9. The generator of claim 1, wherein the fixed electrodes have a declination to the axes of the plasma generator from 0–60 degrees, where the declination is dependent on the plasma generator power and flowrate of the plasma-forming gas.

10. The generator of claim 1, further comprising an electric drive that regulates and maintains of the inter-electrode gap to allow adjustment of the generator.

11. The generator of claim 1, further comprising current limiting reactors with a variable inductance for regulating the current from the multiphase transformer.

12. The generator of claim 6, further comprising a cooling system for current limiting reactors, where the cooling system comprises a flowmeter, a plurality of thermocouples, and flow transducer of water.

* * * * *

UNITED STATES PATENT AND TRADEMARK OFFICE
CERTIFICATE OF CORRECTION

| | |
|---|---|
| PATENT NO. | : 7,135,653 B2 |
| APPLICATION NO. | : 10/731358 |
| DATED | : November 14, 2006 |
| INVENTOR(S) | : Rutberg et al. |

It is certified that error appears in the above-identified patent and that said Letters Patent is hereby corrected as shown below:

On the title page of the patent, the name of the patent in item (12) should read -- Rutberg et al. --.

On the title page of the patent, the first inventor's name of "Alexander P. Routberg" in item (76) should read -- Alexander P. Rutberg --.

Signed and Sealed this

Sixteenth Day of January, 2007

JON W. DUDAS
*Director of the United States Patent and Trademark Office*